United States Patent
Azam et al.

(10) Patent No.: US 11,233,503 B2
(45) Date of Patent: Jan. 25, 2022

(54) TEMPERATURE SENSORS AND METHODS OF USE

(71) Applicant: UNIVERSITY OF UTAH RESEARCH FOUNDATION, Salt Lake City, UT (US)

(72) Inventors: Ali Azam, Salt Lake City, UT (US); Jeffrey Walling, Salt Lake City, UT (US)

(73) Assignee: UNIVERSITY OF UTAH RESEARCH FOUNDATION, Salt Lake City, UT (US)

( * ) Notice: Subject to any disclaimer, the term of this patent is extended or adjusted under 35 U.S.C. 154(b) by 118 days.

(21) Appl. No.: 16/825,128

(22) Filed: Mar. 20, 2020

(65) Prior Publication Data
US 2020/0313664 A1  Oct. 1, 2020

Related U.S. Application Data

(60) Provisional application No. 62/825,136, filed on Mar. 28, 2019.

(51) Int. Cl.
*H03K 7/08* (2006.01)
*G05F 3/08* (2006.01)

(52) U.S. Cl.
CPC ............... *H03K 7/08* (2013.01); *G05F 3/08* (2013.01)

(58) Field of Classification Search
CPC .. H03K 7/08; G05F 3/08; G05F 3/245; G01K 7/01
See application file for complete search history.

(56) References Cited

U.S. PATENT DOCUMENTS

| 7,330,002 B2* | 2/2008 | Joung ................. G09G 3/3406 315/246 |
| 7,579,898 B2 | 8/2009 | Soldera et al. |
| 7,726,877 B1 | 6/2010 | Avitan |
| 7,969,227 B2 | 6/2011 | Hasegawa et al. |

(Continued)

FOREIGN PATENT DOCUMENTS

| CN | 101435724 A | 5/2009 |
| CN | 104833437 A | 8/2015 |

(Continued)

OTHER PUBLICATIONS

U.S. Appl. No. 62/825,127, filed Mar. 28, 2019.

(Continued)

*Primary Examiner* — Jeffrey M Shin
(74) *Attorney, Agent, or Firm* — Dorsey & Whitney LLP

(57) ABSTRACT

Embodiments of the disclosure are drawn to a low-voltage temperature sensor. The temperature sensor may include a waveform generator, a complementary-to-absolute-temperature (CTAT) voltage generator, a voltage reference, two comparators, and digital logic. A waveform of the waveform generator may be compared to both the CTAT voltage and the voltage reference. The output of the comparison of the CTAT and the waveform may be a pulse-width modulated signal that is temperature-dependent. The output of the comparison of the voltage reference and the waveform may be a signal with constant pulse width. The digital logic may receive the pulsed signals and take a ratio of the two signals to determine a temperature.

20 Claims, 9 Drawing Sheets

(56) References Cited

U.S. PATENT DOCUMENTS

| | | | |
|---|---|---|---|
| 8,217,708 | B2 | 7/2012 | Yoshikawa |
| 8,564,275 | B2 | 10/2013 | Seok et al. |
| 8,836,413 | B2 | 9/2014 | Gunther et al. |
| 8,931,953 | B2 | 1/2015 | Law et al. |
| 9,523,613 | B2 | 12/2016 | Takihara et al. |
| 9,804,631 | B2 | 10/2017 | Fort et al. |
| 9,864,392 | B2 | 1/2018 | Georgiou et al. |
| 10,037,047 | B2 | 7/2018 | Quelen |
| 2007/0152741 | A1 | 7/2007 | Rincon-mora et al. |
| 2013/0325391 | A1* | 12/2013 | Kwon ............... G01K 7/01 702/130 |
| 2014/0269839 | A1* | 9/2014 | Tai .................. G01K 7/01 374/184 |
| 2015/0220102 | A1* | 8/2015 | Kwon ............... G05F 3/245 327/513 |
| 2018/0224878 | A1 | 8/2018 | Schober et al. |

FOREIGN PATENT DOCUMENTS

| | | |
|---|---|---|
| CN | 105468085 A | 4/2016 |
| CN | 107506278 A | 12/2017 |
| CN | 107168441 B | 10/2018 |
| JP | 2014149692 A | 8/2014 |
| KR | 101864131 B1 | 7/2018 |

OTHER PUBLICATIONS

U.S. Appl. No. 62/825,136, filed Mar. 28, 2019.
Cahoon, "Low-Voltage CMOS Temperature Sensor Design Using Schottky Diode-Based References", IEEE, 2008, pp. 16-19.
Navidi, et al., "A Low-Power Voltage Reference Cell with a 1.5 V Output", Journal of Low Power Electronics and Applications, 2018, pp. 1-12.
Safari, et al., "Design of a DC/DC buck converter for ultra-low power applications in 65nm CMOS Process", 2012, pp. 1-57.
Somvanshi, et al., "A Low Power Sub-1 V CMOS Voltage Reference", International SOC Conference, 2008, pp. 271-276.

* cited by examiner

TEMPERATURE SENSORS AND METHODS OF USE

RELATED APPLICATION(S)

This application claims priority to U.S. Provisional Application No. 62/825,136 filed on Mar. 28, 2019, the contents of which are incorporated herein by reference for any purpose.

BACKGROUND

Temperature sensors are becoming common building blocks for many modern complementary metal oxide semiconductor (CMOS) systems. As integrated circuits (ICs) become more complex and compact, there has been a growing demand for low power temperature sensors to provide calibration and enable local feedback to ensure reliable performance over process-voltage-temperature (PVT) variations. Most modern microprocessors use multiple temperature sensors in to maintain performance of all the critical blocks over a wide range of operating temperatures, for multiple central processing unit (CPU) cores that may be separated by large physical distances. Apart from these conventional usage, emerging applications (e.g., biomedical applications, infrastructural health monitoring, Internet-of-things (IoT), wearable electronics, MEMs based sensors and actuators, etc.) create new design challenges for temperature sensing. These applications require the temperature sensors to have extremely low power consumption and to be compatible with low supply voltages, so that they can be powered using energy scavenging.

Most temperature sensors require reference voltage and reference current generation to maintain reliable performance. These two blocks create major bottlenecks for the power consumption and supply voltage. Most conventional voltage references are bandgap reference based, which is inherently power hungry. Furthermore, they require higher supply voltages to ensure that their diodes are forward biased. Such bandgaps either operate in open loop, with very low output voltage compared to the threshold voltage of the devices in the subsequent stages or they use active amplifier feedback. Open loop configurations are not desirable because they are susceptible to PVT variations. Feedback amplifiers are not desirable since they require high voltage headroom and additional current consumption for their normal operation.

Alternatively, reference currents generators have high power consumption. Extremely big resistors (~100 MΩ) can reduce power consumption at the sacrifice of huge die area. An alternative approach utilizes N-wells as resistors, but they are non-linear. In general, generating reference currents also involves negative feedback using active amplifiers, which is again power hungry and requires voltage headroom.

SUMMARY

In one or more embodiments, a temperature sensor disclosed herein may include a sawtooth wave generator, a voltage reference, a CTAT generator, two comparators, and digital logic. A sawtooth wave is provided to two comparator circuits. A first comparator compares the sawtooth wave to the voltage output of a complementary-to-absolute-temperature (CTAT) circuit. The output of the CTAT is temperature dependent. A second comparator compares the sawtooth wave to the output of a voltage reference sensor. The output of the voltage reference is independent of temperature. The outputs of the first and second comparators are pulsed signals. The width of the pulses of the first comparator is dependent on the temperature, thus providing a pulse-width-modulated (PWM) signal based on temperature. Digital logic receives the temperature-dependent PWM signal and the temperature-independent pulsed signal and outputs a temperature based on a ratio of the pulse widths of the temperature-dependent and temperature-independent signals.

In some embodiments, the voltage reference uses a temperature stable ultra-low power voltage reference circuit. The voltage reference may include a voltage reference portion and a bulk-feedback portion.

In some embodiments, the CTAT may have the same topology of the voltage reference portion of the voltage reference circuit. In some embodiments, the CTAT may include a high threshold voltage NMOS transistor and a thick gate NMOS transistor. The CTAT may be configured to have a high temperature coefficient (e.g., output voltage varies widely with temperature).

In some embodiments, the voltage of the CTAT may be lower than the voltage of the voltage reference so that the output pulses of the first and second comparators may be identified. In other embodiments, a synchronization circuit may be used to identify the CTAT and voltage reference pulses.

The comparators may each be implemented by a typical comparator circuit in some examples. However, in some examples, the comparator circuit may be operated in sub-threshold conduction mode to generate a tail current. Thus, high voltage threshold devices may be selected for the NMOS devices and low voltage threshold devices may be selected for the PMOS devices in some embodiments.

In an embodiment, a method for generating a temperature measurement may include generating a pulsed voltage signal, such as a sawtooth signal. In a first comparison, the pulsed signal may be compared to a temperature stable output voltage. The output of the first comparison may be a PMW signal, but the width of the pulses may be constant due to the temperature-stable output voltage. The pulsed signal may also be compared to a temperature-dependent output voltage. The output of this second comparison may also be a PMW signal. The width of the pulses may vary proportionally with temperature. A ratio of the width of the pulses of the first comparison and the width of the pulses of the second comparisons may be found. The ratio of the pulse widths may correspond to a temperature measurement.

DETAILED DESCRIPTION

The following description of certain embodiments is merely exemplary in nature and is in no way intended to limit the scope of the disclosure or its applications or uses. In the following detailed description of embodiments of the present apparatuses, systems and methods, reference is made to the accompanying drawings which form a part hereof, and which are shown by way of illustration specific embodiments in which the described apparatuses, systems and methods may be practiced. These embodiments are described in sufficient detail to enable those skilled in the art to practice presently disclosed apparatuses, systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Temperature sensors described herein may eliminate the necessity for current references. Temperature sensors described herein may use CMOS based sub-threshold voltage references. However, instead of using open loop operation, the voltage reference uses a complementary-to-absolute-temperature (CTAT) stage connected to a bulk as a negative feedback mechanism. Hence, temperature sensors described herein may achieve an excellent temperature coefficient (TC) even if supplied by a voltage as low as 350 mV. Because of this, temperature sensors described herein may have power consumption in the pico-watt range.

Figure 1:
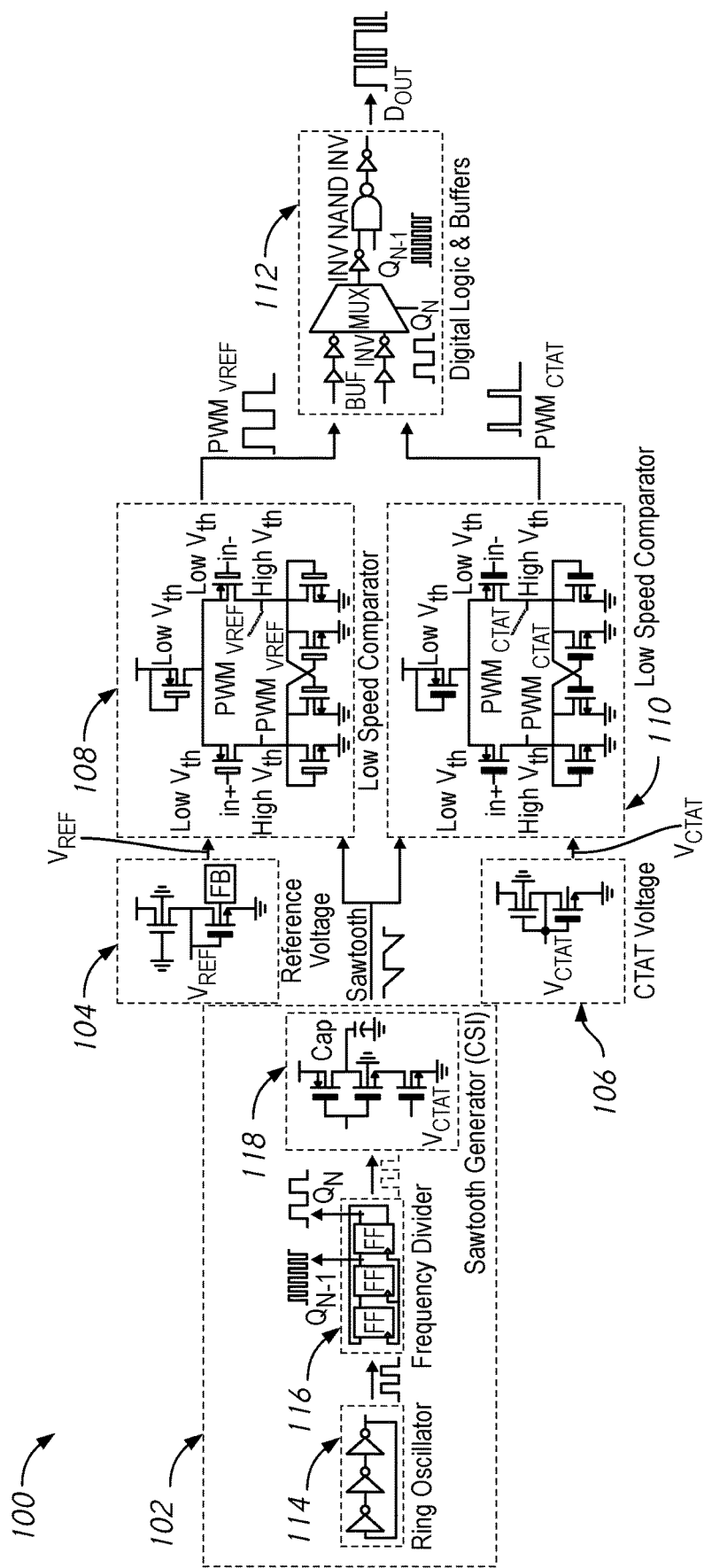
FIG. 1 is a functional block diagram of a temperature sensor circuit in accordance with examples described herein.

FIG. 1 is a functional block diagram of a temperature sensor circuit 100 in accordance with examples described herein. The temperature sensor circuit 100 may include a waveform generator circuit 102, a reference voltage circuit 104, a complementary-to-absolute-temperature (CTAT) circuit 106, a first comparator circuit 108, and a second comparator circuit 110. In some examples, the temperature sensor circuit 100 may further include an output stage circuit 112.

The waveform generator circuit 102 may include an oscillator circuit 114, a frequency divider circuit 116, and a sawtooth generator circuit 118. The oscillator circuit 114 may provide a first periodic signal (e.g., a square wave) to the frequency divider circuit 116, which may provide a second periodic signal having a lower frequency than the first periodic signal to the sawtooth generator circuit 118. In some examples, the frequency divider may provide timing signals $Q_{N-1}$ and $Q_N$ to the output stage circuit 112. The sawtooth generator circuit 118 may provide a sawtooth waveform based, at least in part, on the second periodic signal received from the frequency divider circuit 116.

The reference voltage circuit 104 may provide a reference voltage signal $V_{REF}$ that does not vary (e.g., is constant) with temperature. The CTAT circuit 106 may provide a signal $V_{CTAT}$ that does vary with temperature (e.g., is temperature dependent). Both $V_{REF}$ and $V_{CTAT}$ are compared to the sawtooth waveform by comparator circuit 108 and comparator circuit 110, respectively. The comparator circuit 108 may provide a pulse-width-modulated (PWM) signal $PWM_{VREF}$ based, at least in part, on the comparison between $V_{REF}$ and the sawtooth waveform. However, because $V_{REF}$ is constant, the width of the pulses of $PWM_{VREF}$ is also constant. The comparator circuit 110 may provide a PWM signal $PWM_{CTAT}$ based, at least in part, on the comparison between $V_{CTAT}$ and the sawtooth waveform. The width of the pulses of $PWM_{CTAT}$ may vary based, at least in part, on temperature, at least because $V_{CTAT}$ varies with temperature.

The output stage circuit 112 may receive the $PWM_{VREF}$ and the $V_{CTAT}$ signals and combine the signals into a single output waveform $D_{OUT}$. The generation of the output waveform $D_{OUT}$ may be based, at least in part, on the timing signals $Q_N$ and $Q_{N-1}$ provided by the frequency divider circuit 116, as will be described in more detail herein. The temperature may be determined based on a ratio of the pulses of the output waveform $D_{OUT}$.

Figure 2:
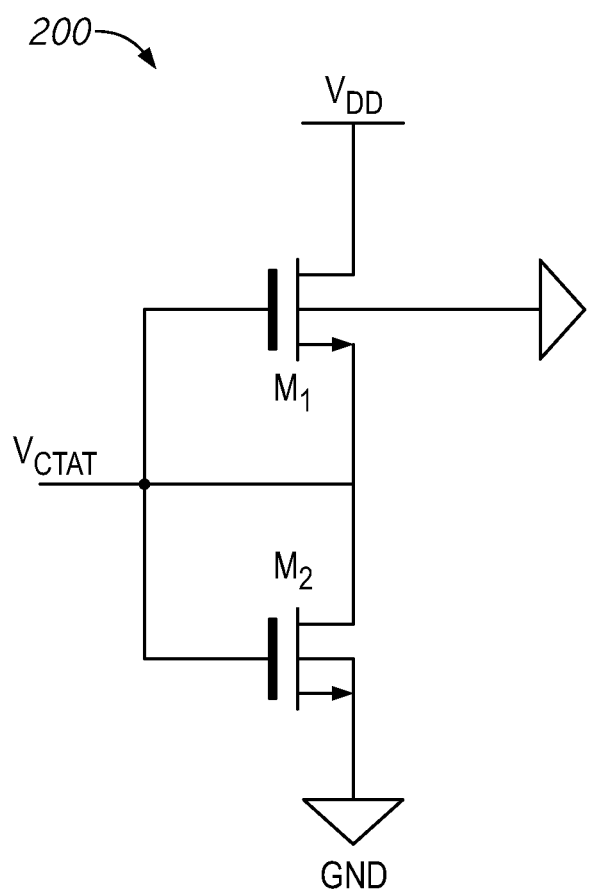
FIG. 2 is a circuit diagram of a CTAT circuit in accordance with examples described herein.

FIG. 2 is a circuit diagram of a CTAT circuit in accordance with examples described herein. The CTAT circuit 200 may be used to implement the CTAT circuit 106 shown in FIG. 1 in some examples. The CTAT circuit 200 may include a first N-channel metal oxide semiconductor (NMOS) transistor $M_1$ and a second NMOS transistor $M_2$ coupled in series between a voltage supply $V_{DD}$ and a common voltage (e.g., ground). The drain of $M_1$ may be coupled to $V_{DD}$ and the source of $M_1$ may be coupled to the drain and gate of $M_2$. The substrate (e.g., bulk) of $M_1$ may be coupled to ground. The source and substrate of $M_2$ may be coupled to ground. A temperature-varying (e.g., temperature-dependent) voltage $V_{CTAT}$ may be provided at a node coupled to the gates of $M_1$ and $M_2$, the source of $M_1$, and the drain of $M_2$.

While non-linearities in the temperature-variance of $V_{CTAT}$ may lead to inaccuracies in temperature measurements, the slope and voltage level of the $V_{CTAT}$ are not critical to accuracy, which may provide some freedom in the design of the CTAT circuit 200. In some examples, the output voltage of the CTAT circuit 200 may be calculated by assuming that the same the drain current flows through both $M_1$ and $M_2$. Both transistors may be operating in the sub-threshold region, hence by equating the sub-threshold drain currents for both transistors and noting that the gate-to-source voltage of $M_1$ ($V_{GS1}$) is equal to the drain-to-source voltage of $M_2$ ($V_{DS2}$), $V_{GS1}=V_{DS2}=V_{CTAT}$, $V_{CTAT}$ is given by the following:

$$V_{CTAT} = f(k)\Delta V_{th} + f_1(k)V_T \ln\left(\frac{W_1 L_2}{W_2 L_1}\right) \qquad \text{Equation 1}$$

where $f(k)$ depends on the work function, k, $\Delta V_{th}$ is the difference in threshold voltages of the devices (e.g., $V_{th,M1} - V_{th,M2}$), $V_T$ is the thermal voltage, and $W_1$ and $W_2$ are the widths and $L_1$ and $L_2$ are the lengths of $M_1$ and $M_2$, respectively.

The CTAT circuit 200 may be used to generate either a CTAT or a proportional-to-absolute temperature (PTAT) voltage. As used herein, a CTAT voltage source means a voltage source with a negative temperature coefficient (TC) and a PTAT voltage source means a voltage source with a positive TC. The operation of the CTAT circuit 200 as CTAT or PTAT only depends on the ratio of the nominator and denominator inside the logarithmic term in Equation 1. However, in some applications, CTAT operation may be preferred because it may provide a more linear output voltage characteristic, with respect to temperature.

In some examples, the first step to designing the CTAT circuit 200 is to choose the lowest possible threshold voltage NMOS as the first transistor $M_1$ and a higher threshold voltage NMOS as the second transistor $M_2$. It may be desirable in some applications to have a large ratio in the logarithmic term in Equation 1, which may increase the sensitivity of the output voltage $V_{CTAT}$ with respect to temperature as a larger temperature coefficient (TC) magnitude increases the sensitivity of the pulse generation. Hence, a minimum width device may be chosen for $M_1$ and a minimum length device may be chosen for $M_2$. In some examples, stack devices can be used to increase the effective gate length. This may increase sensitivity and/or reduce power consumption. In some applications, the width of $M_2$ may be constrained by the available area for the design. Hence, when area is not a concern, more devices can be stacked to increase the effective length or paralleled to increase the effective width. Because threshold voltage is process dependent, the optimal devices and device sizes should be found for the individual complementary metal oxide semiconductor (CMOS) process being used, with the overall goal of maximizing $\Delta V_{th}$, given the constraints of the individual process development kit (PDK).

In a 65 nm process used in an example implementation of the present disclosure, to maximize the $\Delta V_{th}$ between $M_1$ and $M_2$, $M_1$ was chosen to be a low $V_{th}$ device ($V_{th} \approx 275$ mV) and $M_2$ was chosen to be a 2.5V I/O device ($V_{th} \approx 525$ mV). The device size (W/L) for $M_1$ is 120 nm/20 μm and for $M_2$ is 1 μm/280 nm.

Figure 3:
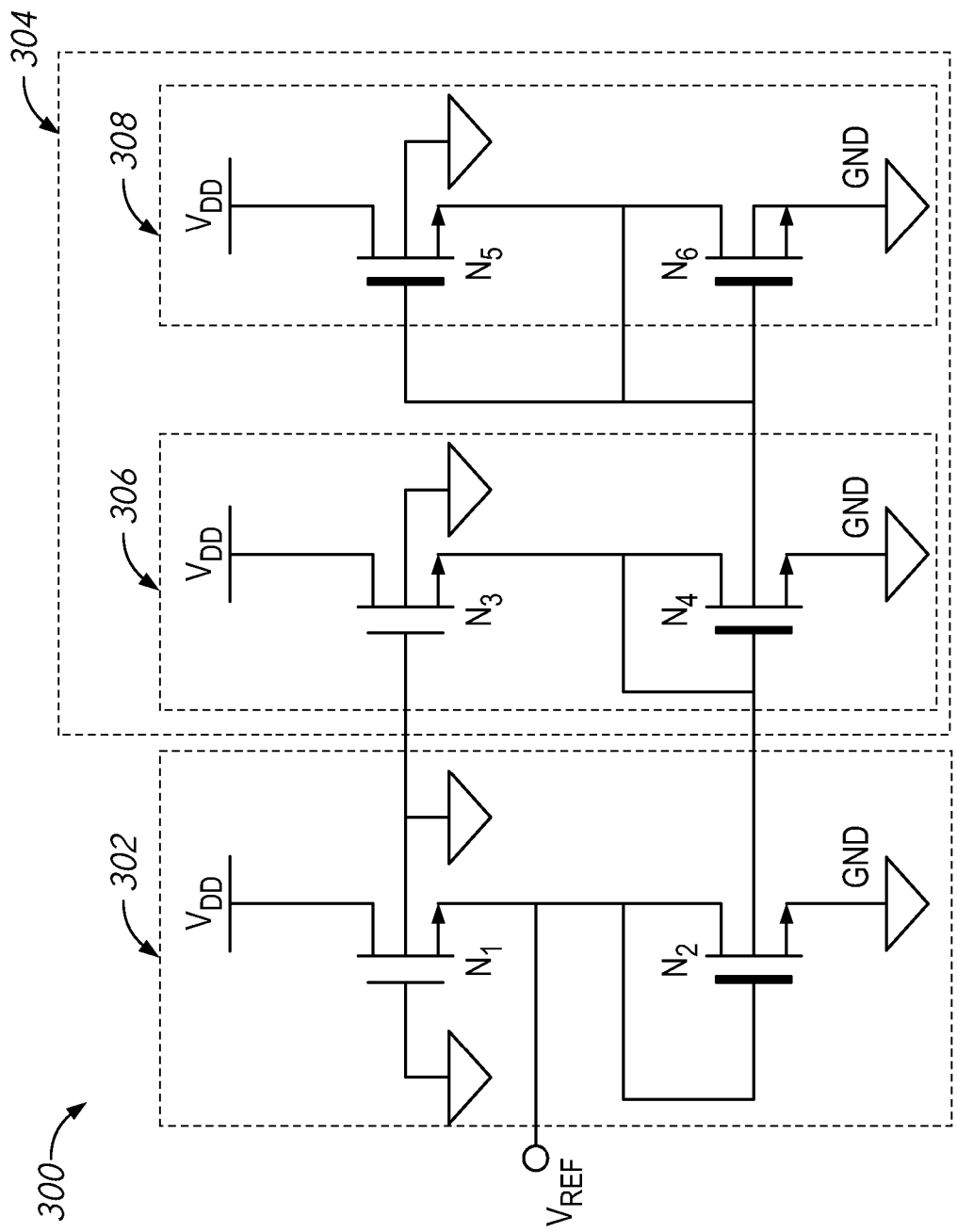
FIG. 3 is a circuit diagram of a voltage reference circuit in accordance with examples described herein.

FIG. 3 is a circuit diagram of a voltage reference circuit in accordance with examples described herein. In some examples, the voltage reference circuit 300 may be used to implement the voltage reference circuit 104 in FIG. 1. The reference circuit 300 may include a main stage 302 that provides a reference voltage VREF. The reference circuit 300 may further include a bulk feedback network 304, which may include a first auxiliary stage 306 and optionally, a second auxiliary stage 308.

The main (e.g., first) stage 302 may include a first metal oxide semiconductor field effect transistor (MOSFET) device $N_1$ and a second MOSFET device $N_2$ coupled in series. The gate of $M_1$ may be coupled to a common voltage (e.g., ground). The drain of $N_1$ may be coupled to a supply voltage $V_{DD}$. The source of $N_1$ may be coupled to the drain and the gate of $N_2$. The source of $N_2$ may be coupled to ground. A reference voltage $V_{REF}$ may be provided at a node between the source of $N_1$ and the gate and drain of $N_2$.

Turning to the bulk feedback network 304, the first auxiliary stage 306 may include MOSFET devices $N_3$ and $N_4$ coupled in series. The drain of $N_3$ may be coupled to the supply voltage $V_{DD}$ and the gate of $N_3$ may be coupled to the substrate of $N_1$ and ground. The substrate of $N_3$ may be coupled to ground. The source of $N_3$ may be coupled to the drain and gate of $N_4$ as well as the substrate of $N_2$. The source of $N_4$ may be coupled to ground. Optionally, a second auxiliary stage 308 including devices $N_5$ and $N_6$ coupled in series may be included to compensate for the temperature dependency of the main stage ($N_1$-$N_2$). In some applications, adding a second auxiliary stage 308 may further reduce temperature sensitive of the reference voltage. However, in some examples, the second auxiliary stage 308 may be omitted, which may save power and/or die area. Second auxiliary stage 308 may include MOSFET devices $N_5$ and $N_6$. The gates of $N_5$ and $N_6$ may be coupled to the substrate of $N_4$. The source of $N_5$ and the drain of $N_6$ may also be coupled to the substrate of $N_4$. The drain of $N_5$ may be coupled to the supply voltage $V_{DD}$ and the substrate of $N_5$ may be coupled to ground. The substrate and source of $N_6$ may be coupled to ground.

In some of the examples, such as the one shown in FIG. 3, all of the devices N1-N6 may be NMOS devices. In some examples, $N_1$ and $N_2$ should be selected with significant threshold voltage differences, which may allow a higher output voltage to be achieved even when constrained with a low supply voltage $V_{DD}$. In some applications, a design constraint may be that the drain-to-source voltage ($V_{DS}$) should be $>3 \times V_T$ which may reduce the effect of the exponential $V_{DS}$ dependent term of the well-known sub-threshold MOS current equation, given as follows:

$$I_D = k'(f-1)V_T^2 e^{\frac{(V_{GS}-V_{th})}{\hat{N}_T}} \left(1 - e^{\frac{-V_{DS}}{V_T}} + \frac{V_{DS}}{V_A}\right) \quad \text{Equation 2}$$

In a traditional two-transistor (2T) voltage reference, Equation 2 restricts simultaneously achieving a high output reference voltage, while using a low-supply voltage. Moreover, the source-to-bulk voltage may not be the same for both $N_1$ and $N_2$, which may lead to deviation from calculated behavior. Consequently, the output voltage may be prone to variation over process corners (e.g., slow-slow (ss), typical (u) and fast-fast (ff)) in a 65 nm CMOS process for optimized 2T voltage references.

In some examples, the size of the devices may be optimized for the tt-corner. Though the output voltage is relatively flat in the tt-corner, there may be significant voltage variation across the ff and particularly the ss corner. Any variation in the reference voltage level may translate to temperature error in the temperature sensor (e.g., temperature sensor circuit 100) as this may lead to a temperature dependent variation in the reference pulse width $PWM_{VREF}$. However, unlike traditional 2 T voltage references, the bulk feedback network 304 of reference voltage circuit 300 may mitigate deviation by providing compensation across temperature. The voltage reference circuit 300 controls the bulk/body voltage using a replica of the same circuit with the bulk feedback network 304, which may offset the temperature deviation of the main stage 302, even at low $V_{DS}$. By allowing a reduction in $V_{DS}$, the power supply voltage, $V_{DD}$ can be reduced. This may also reduce power consumption and may allow for operation from scavenged energy sources.

In some examples, the devices $N_1$-$N_6$ in the voltage reference circuit 300 may use maximum channel lengths, which may reduce power consumption. Shorter channel lengths may be used if other optimization goals are desired (e.g., reduced area). This may be at the expense of increased power consumption. In an example implementation of the voltage reference circuit 300 in a 65 nm process, the width/length for each device in FIG. 3 is $N_1$: 3.6 μm/80 μm, $N_2$:3.65μm/80 μm, $N_3$:500 nm/80 μm, $N_4$:100 μm/80 μm, $N_{5,6}$:400 nm/40 μm.

In some examples, devices $N_1$ and $N_2$ should have approximately equal W/L, but the ratio may be determined, based at least in part, on the power budget, the available area, and/or the minimum desired supply voltage. It should be noted that reduction of the supply voltage may result in a lower $V_{DS}$ and hence, may result in a temperature gradient.

As mentioned previously, the resulting temperature gradient of the main stage 302 from low voltage operation is compensated with the bulk feedback network 304. Depending on the PTAT/CTAT nature of temperature gradient of the main stage 302, the bulk feedback network 304 may be designed to control the bulk voltage of ($N_2$) using a replica stage that is optimized to provide an opposing operation. If the main stage has a PTAT (CTAT) response, the feedback stages (e.g., auxiliary stages 306, 308) may also be designed to provide PTAT (CTAT) responses. This is because increasing (decreasing) the bulk voltage may increase (decrease) the threshold voltage, which may compensate for temperature dependent reduction in the output voltage. In short, the concept is to use a temperature dependent voltage source (CTAT/PTAT) to control the threshold voltage to compensate for the temperature dependency of the reference voltage $V_{REF}$.

More details for voltage reference circuits, such as voltage reference circuit 300, may be found in U.S. application Ser. No. 16/825,071, entitled "Voltage References and Design Thereof," filed on the same date as the instant application, which is incorporated herein by reference for any purpose.

It is noted that the deviation of the magnitude of $V_{REF}$ across process corners does not impact the overall error of the temperature sensor, as long as $V_{REF}$ does not vary with temperature. A smaller magnitude $V_{REF}$ may result in a shorter duration of the reference pulse signal $PWM_{VREF}$, which is generated for the PWM signal, because the reference pulse is generated by comparison to a sawtooth waveform (e.g., see FIG. 1). This may reduce the resolution of the temperature sensor but may not directly translate to temperature error in the final output $D_{OUT}$. Hence, a static shift in $V_{REF}$ may change the reference pulse width, but the relative change may be the same across all temperatures. On the contrary, any variation of $V_{REF}$ with respect to temperature may contribute to error in temperature readings. This is because changes in the voltage level across temperature correspond to differing reference pulse widths across temperatures.

Figure 4:
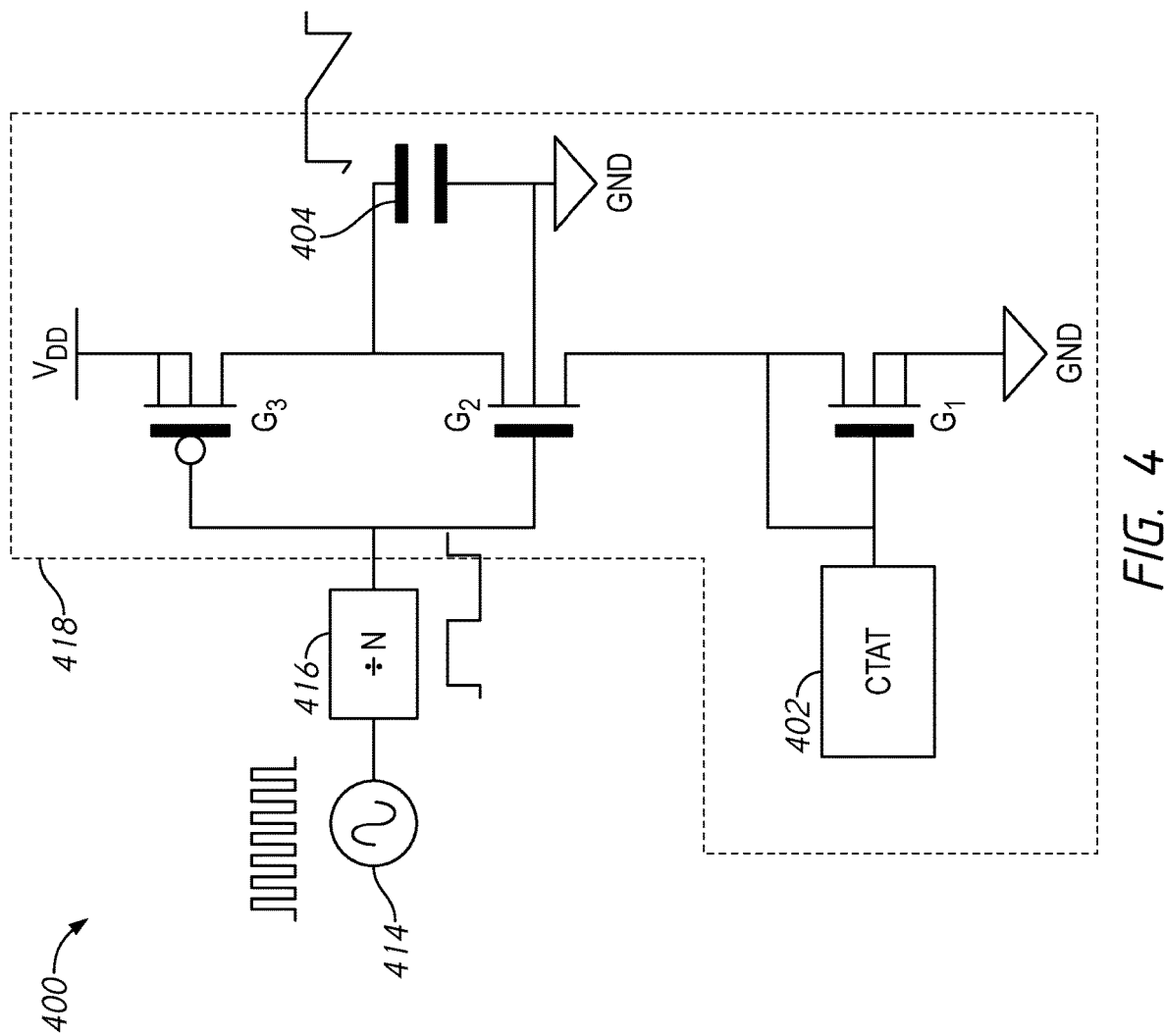
FIG. 4 is a circuit diagram of a waveform generator circuit in accordance with examples described herein.

FIG. 4 is a circuit diagram of a waveform generator circuit 400 in accordance with examples described herein. In some examples, the waveform generator circuit 400 may be used to implement the waveform generator circuit 102 of FIG. 1. The waveform generator circuit 400 may include an oscillator circuit 414, a frequency divider circuit 416, and a sawtooth generator circuit 418.

In some examples, the oscillator circuit 414 may include an inverter-based ring oscillator circuit (e.g., see inverters in oscillator circuit 114 in FIG. 1). Though ring oscillators may be relatively more power hungry than alternatives (e.g., relaxation oscillators), the ring oscillator may provide reliable operation and/or relatively stable output period and duty cycle. In an example implementation, the oscillator circuit 414 has an output frequency≈1.07 kHz (≈24.38 kHz) at −20° C. (100° C.). In some examples, the frequency may be designed to be several times higher than needed in the lowest temperature operation so that multiple readings can be averaged, which may reduce the impact of noise on the reading. Using a higher frequency may enable better temporal resolution in the measurement and/or data conversion. Though higher frequency oscillators (e.g., clocks) may allow better temporal resolution and/or may be smaller in size, higher frequency oscillators may require more power. Hence frequency selection of the oscillator circuit 414 may be a compromise between the power consumption and temporal resolution that is desired.

To save power in the subsequent stages of the sawtooth and PWM generation, the oscillation frequency may be reduced with the frequency divider circuit 416. The frequency divider circuit may include cascaded true-single-phase flip-flops (e.g., see flip flops in frequency divider circuit 116 in FIG. 1), with a total divide ratio of 16. Although not shown in FIG. 4, as mentioned previously with reference to FIG. 1, the frequency divider circuit 416 may also be used to generate timing signals $Q_{N-1}$ and $Q_N$. In some examples, $Q_N$ may be provided from an output of the last flip-flop of the frequency divider circuit 416 and $Q_{N-1}$ may be provided from an output of the second-to-last flip-flop of the frequency divider circuit 416.

In some examples, the sawtooth generator circuit 418 may include a capacitively loaded, current-starved inverter (CSI). The inverter may include a P-channel MOS transistor (PMOS) $G_3$, an NMOS transistor $G_2$, and a capacitor 404. The gates of $G_3$ and $G_2$ may receive the output of the frequency divider circuit 416. The source and substrate of $G_3$ may be coupled to voltage supply $V_{DD}$. The drains of $G_3$ and $G_2$ may be coupled to the capacitor 404. The capacitor 404 and the substrate of $G_2$ may be coupled to ground. In some examples, the sawtooth waveform may be provided at node of the capacitor 404.

To ensure the duty cycle of the sawtooth waveform is consistent across temperature, the CSI's current source may be biased using a replica CTAT generator circuit 402 in some examples. The CTAT generator circuit 402 may be coupled to the inverter by NMOS transistor $G_1$. The output of the CTAT generator circuit 402 may be provided to the gate and drain of $G_1$. The drain of $G_1$ may further be coupled to the source of $G_2$. The substrate and source of $G_1$ may be coupled to ground. In some examples, the CTAT generator circuit 402 may be identical to the one used as the temperature sensor (e.g., CTAT circuit 106, CTAT circuit 200) and co-located, which may minimize temperature differences. This may permit the charging/discharging current of the load capacitor to be compensated for across temperature.

In some examples, all of the MOS devices $G_1$-$G_3$ may be high threshold voltage devices. In an example implementation, the W/L of the devices may be: $G_1$:200 nm/2 µm, $G_2$:120 nm/50 nm, and $G_3$:120 nm/1 µm.

In some applications, the oscillator frequency may change with respect to temperature. Frequency variation is acceptable, with the caveat that the frequency variation does not impact the duty cycle of the voltage pulses that will be generated (e.g., the sawtooth waveform). The value of the capacitor in the sawtooth generator circuit 418 may be used to maintain the duty cycle in some examples. The temperature sensor may rely on linear operation; hence the value of capacitor 404 may be selected so that a linear ramp is provided across the entire temperature range. Using a very large PMOS pull-up $G_3$ device may provide a fast reset or pre-charge switch which charges the capacitor 404 to the rail voltage. The frequency of oscillation changes due to the temperature and capacitor value may be chosen in such a way that the capacitor 404 discharges completely before the next cycle starts. The optimum boundary condition for the capacitor value may be found by the equation:

$$\frac{0.5}{5f_{min}} > r_{SW}C > \frac{0.25}{5f_{max}} \qquad \text{Equation 3}$$

Where $f_{max}$ and $f_{max}$ are the maximum and minimum oscillation frequencies across the operating temperature range and $r_{sw}$ is the channel resistance. The capacitance is chosen to provide a linear ramp while ensuring that the capacitor 404 discharges in one half period of $f_{max}$. In an example implementation, the capacitance of the capacitor 404 may be 1.5 pF.

Figure 5:
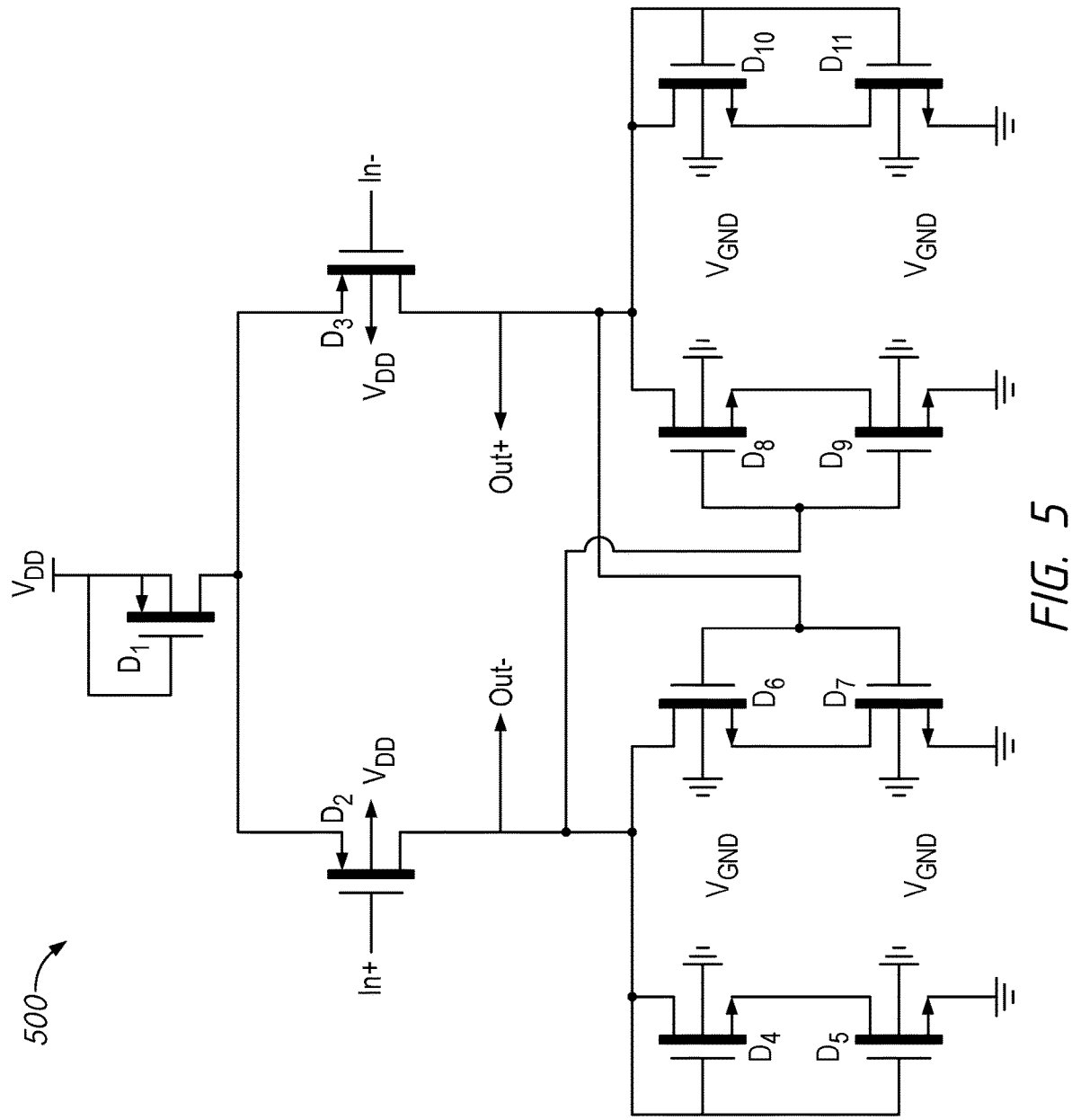
FIG. 5 is a circuit diagram of a comparator circuit in accordance with examples described herein.

FIG. 5 is a circuit diagram of a comparator circuit in accordance with examples described herein. In some examples, the comparator circuit 500 may be used to implement comparator circuit 108 and/or comparator circuit 110 shown in FIG. 1. The comparator circuit 500 may include a PMOS input and a cross-coupled (latch-based) NMOS active load.

The comparator circuit 500 may include a PMOS device $D_1$ coupled between supply voltage $V_{DD}$ and two PMOS devices $D_2$ and $D_3$. The sources of PMOS devices $D_2$ and $D_3$ may be coupled to the drain of $D_1$ and the drains of $D_2$ and $D_3$ may be coupled to the cross-coupled NMOS active load (e.g., $D_4$-$D_{11}$). $D_2$ and $D_3$ may receive inputs In+ and In− at their respective gates. In some examples, the inputs may be the sawtooth waveform and one of the $V_{CTAT}$ or $V_{REF}$. Outputs of the comparator circuit 500 may be provided from the drains of $D_2$ and $D_3$. In some examples, the outputs may be the $PWM_{VREF}$ or the $PWM_{CTAT}$.

Turning to the NMOS active load, NMOS devices $D_4$ and $D_5$ may be coupled in series between the drain of $D_2$ and ground and NMOS devices $D_6$ and $D_7$ may be coupled in series between the drain of $D_2$ and ground, in parallel with $D_4$ and $D_5$. The gates of $D_4$ and $D_5$ may be coupled to the drain of $D_2$ while the gates of $D_6$ and $D_7$ are coupled to the drain of $D_3$. Similarly, NMOS devices $D_8$ and $D_9$ may be coupled in series between the drain of $D_3$ and ground and NMOS devices $D_{10}$ and $D_{11}$ may be coupled in series between the drain of $D_3$ and ground in parallel with $D_8$ and $D_9$. The gates of $D_8$ and $D_9$ may be coupled to the drain of $D_2$ and the gates of $D_{10}$ and $D_{11}$ may be coupled to the drain of $D_3$.

In some examples, the design of the comparator circuit 500 may be standard with one exception: the tail current source may be a transistor operating in sub-threshold conduction. Because rail-to-rail swing may not possible with this choice, the NMOS transistors $D_4$-$D_{11}$ may be chosen as high-$V_{th}$ devices, while the PMOS devices $D_1$-$D_3$ are chosen as low-$V_{th}$ devices. In some applications, this may maximize the output voltage swing. In an example implementation, the W/L of the PMOS and NMOS devices may be: $D_1$:1 µm/60 nm, $D_2$, $D_3$:5 µm/240 nm, $D_4$, $D_5$, $D_{10}$, $D_{11}$:5.1 µm/120 nm, $D_6$, $D_7$, $D_8$, $D_9$:5 µm/120 nm.

Figure 6:
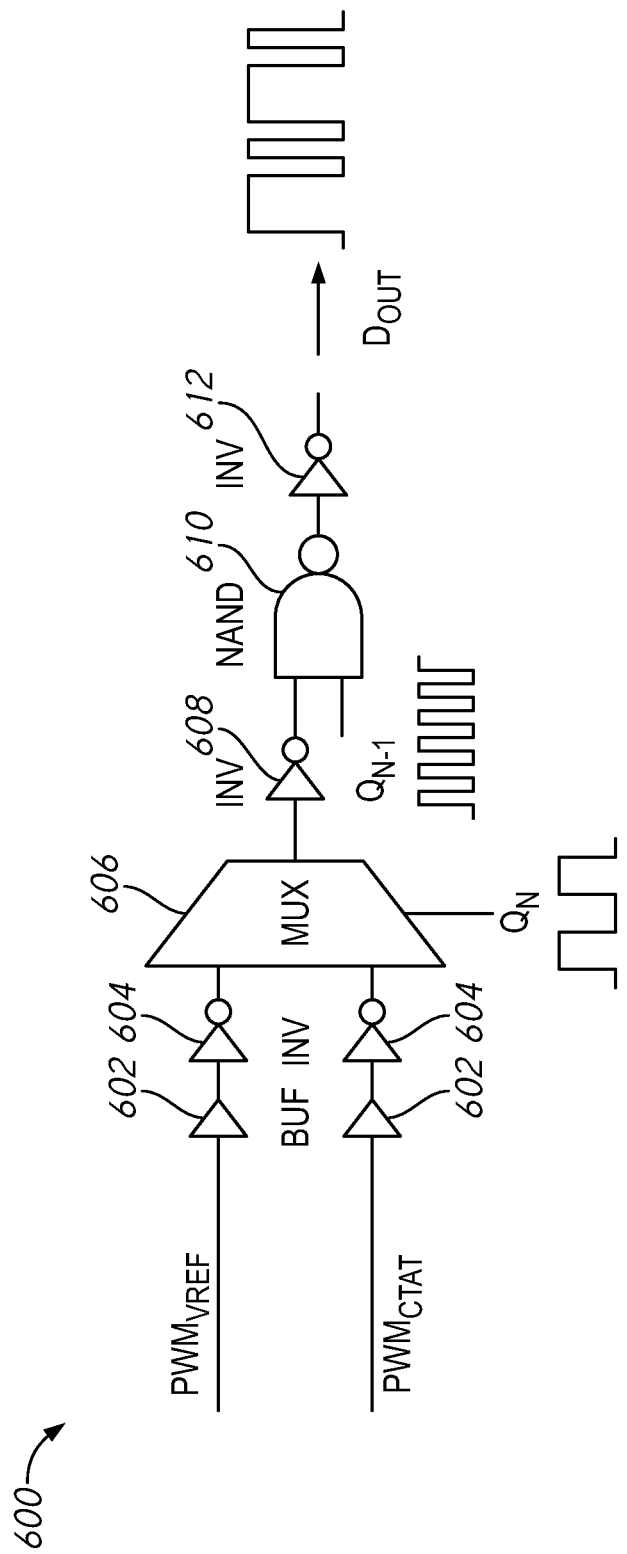
FIG. 6 is a circuit diagram of an output stage circuit in accordance with examples described herein.

FIG. 6 is a circuit diagram of an output stage circuit in accordance with examples described herein. In some examples, the output stage circuit 600 may be used to implement output stage circuit 112 shown in FIG. 1. The output stage circuit 600 may include buffers and logic circuits for generating an output signal of a temperature sensor, such as temperature sensor circuit 100.

The output stage circuit 600 may two PWM signals $PWM_{VREF}$ or the $PWM_{CTAT}$. In some examples, the PWM signals may be provided as outputs from comparator circuits, such as comparator circuits 108 and 110 in FIG. 1. The PWM signals may be received by buffers 602 and provided to inverters 604. The inverters 604 may provide the inverted PWM signals to a multiplexer (MUX) 606. To combine the reference pulses of $PWM_{VREF}$ with the CTAT voltage pulses of $PWM_{CTAT}$, the MUX 606 may be clocked by a periodic signal $Q_N$. The signal $Q_N$ may be provided by a frequency divider circuit, such as frequency divider circuit 116 in FIG. 1 in some examples. When the signal $Q_N$ is in a first state (e.g., logic high or low), the inverted $PWM_{VREF}$ is provided at an output of the MUX 606. When the signal $Q_N$ is in a second state (e.g., logic low or high), the inverted $PWM_{CTAT}$ is provided at the output of the MUX 606.

The outputs of the MUX 606 may be provided to inverter 608, which provides the $PWM_{CTAT}$ or $PWM_{VREF}$ to a first input of a NAND logic circuit 610. The NAND logic circuit 610 may further receive a periodic signal $Q_{N-1}$ as a second input. In some examples, signal $Q_{N-1}$ may be provided by the frequency divider circuit. The NAND logic circuit 610 may provide an output to an inverter 612, which may output a PWM waveform $D_{OUT}$ that contains both $PWM_{CTAT}$ and $PWM_{VREF}$ pulses. As was previously described, the temperature information is contained in the ratio between the pulse widths (e.g., time duration) of the $PWM_{CTAT}$ and $PWM_{VREF}$ pulses.

Figure 7:
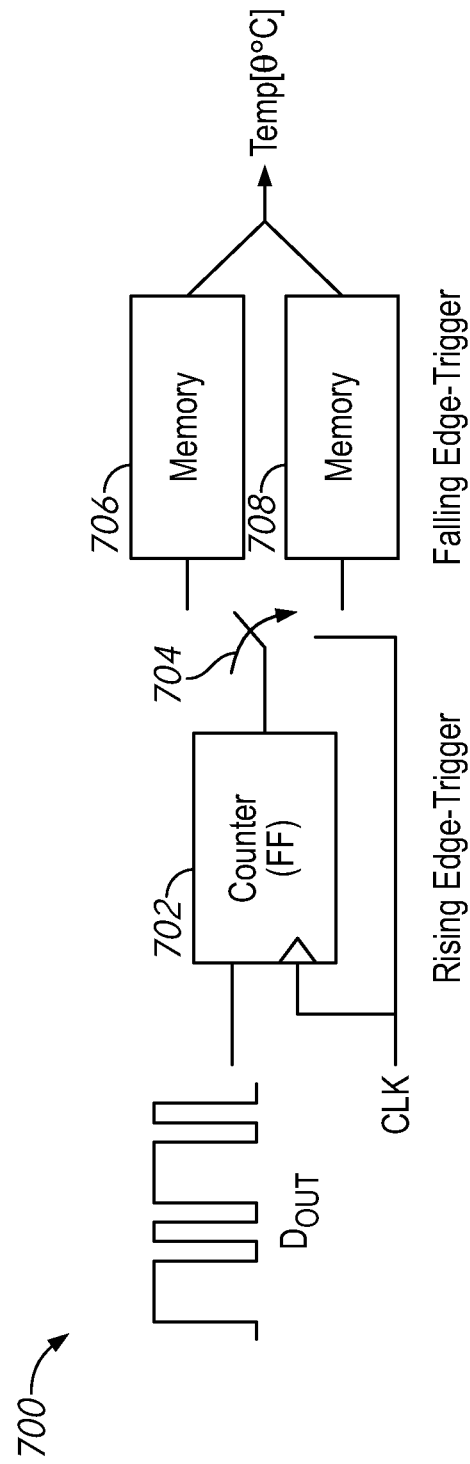
FIG. 7 is a block diagram of a digital implementation for outputting a temperature from a temperature sensor in accordance with examples described herein.

FIG. 7 is a block diagram of a digital implementation for outputting a temperature from a temperature sensor in accordance with examples described herein. In some examples, the digital implementation 700 may be used to output a temperature from temperature sensor 100 in FIG. 1. The digital implementation 700 may receive a PWM waveform $D_{OUT}$ from a temperature sensor. In some examples, the waveform $D_{OUT}$ may be received from an output stage circuit, such as output stage circuit 112 and/or output stage circuit 600. The output of the temperature sensor $D_{OUT}$ may be digitized using a time-to-digital converter (TDC), such as a counter 702. The counter 702 may provide a digitized version of the pulse widths of $D_{OUT}$ by generating a count, based at least in part, on a clock signal CLK. The output of the counter 702 may be provided to memory 706 or memory 708 depending on the state of a switch 704. The memories 706, 708 may determine a ratio of the pulse widths and output the temperature Temp detected by the temperature sensor. In other examples, the output $D_{OUT}$ waveform may be used to wirelessly transmit the temperature using an on/off-keying (OOK) transmitter and the recovered signal could be digitized at the receiver to further save power.

Regardless of the desired output implementation used, before temperature is measured with the temperature sensor circuit, a two-point temperature calibration may be performed to estimate a slope and an absolute level of the CTAT circuit (e.g., CTAT circuit 106, CTAT circuit 200), since the absolute level and temperature coefficient (TC) of the CTAT circuit may change due to PVT variations. This calibration may be performed offline and may be performed during validation after manufacture. The output $V_{CTAT}$ of the CTAT circuit is linear with respect to temperature, hence any two voltage measurements at different temperatures may provide the requisite calibration data. Additionally, the magnitude of the reference voltage level of a reference voltage circuit (e.g., reference voltage circuit 104, reference voltage circuit 300) may be recorded during the calibration, since the reference voltage circuit's absolute level may be affected by process variations.

In some examples, the system is designed such that the reference pulse $PWM_{VREF}$ is always longer than the CTAT pulse $PWM_{CTAT}$. This is done by ensuring that the maximum value of the CTAT voltage never exceeds the value of the reference voltage.

After calibration, the temperature is read according to the following equation:

$$\frac{\tau_{REF}}{\tau_{CTAT}} = \frac{V_{DD} - V_{CTAT}}{V_{DD} - V_{REF}} \qquad \text{Equation 4}$$

Where $\tau_{REF}$ and $\tau_{CTAT}$ are the pulse-widths of the output pulses representing for the $PWM_{VREF}$ and $PWM_{CTAT}$ pulses in the output PWM waveform $D_{OUT}$, respectively. $V_{CTAT}$ can be solved for from Equation 4 and then the measured temperature can be found using the known linear relationship of $V_{CTAT}$ with respect to temperature that is found by the aforementioned two-point calibration. In some examples, the temperature may be monitored over multiple periods (e.g., 3, 5, 10) and the results averaged to provide the final temperature reading.

Figure 8:
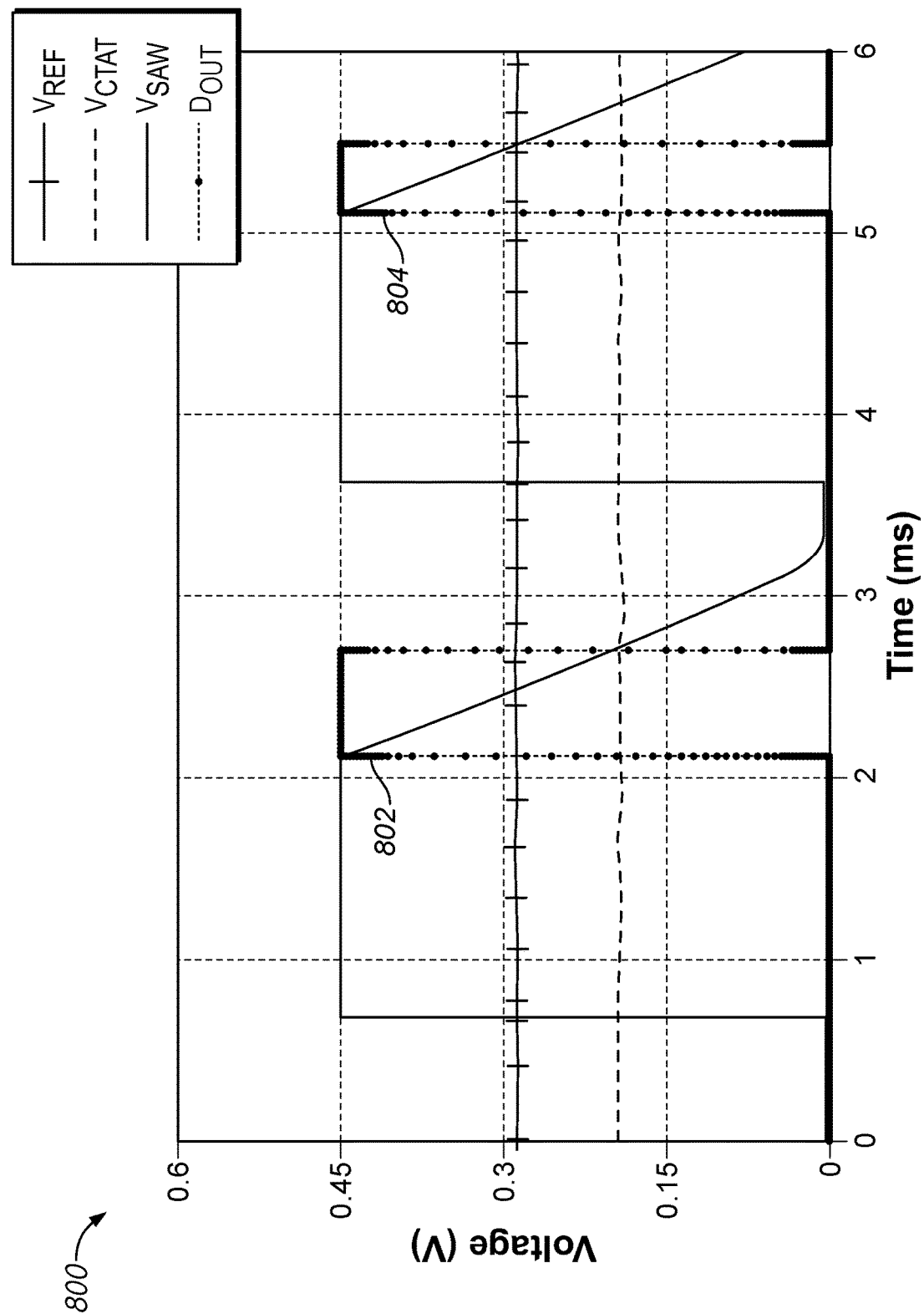
FIG. 8 is a plot of various waveforms generated by a temperature sensor in accordance with examples described herein.

FIG. 8 is a plot of various waveforms generated by a temperature sensor circuit in accordance with examples described herein. Plot 800 displays voltage versus time plots for a voltage reference $V_{REF}$, a temperature-sensitive voltage $V_{CTAT}$, an output of a waveform generator circuit $V_{SAW}$, and a pulse width modulate signal $D_{OUT}$. In some examples, $V_{REF}$ may be output by voltage reference circuit 104, $V_{CTAT}$ may be output by a CTAT circuit 106, $V_{SAW}$ may be output by waveform generator circuit 102, and $D_{OUT}$ may be generated by output stage circuit 112. In the plot 800, two pulses of $D_{OUT}$ can be observed. The first pulse 802 corresponds to a reference pulse from $PWM_{VREF}$ and the second pulse 804 corresponds to temperature-sensitive pulse from $PWM_{CTAT}$.

The $PWM_{VREF}$ pulse width that is generated is intended to be constant across temperature, since $V_{REF}$ does not change with respect to temperature; hence the comparison threshold may be constant. The $PWM_{CTAT}$ pulse width that is generated does change with respect to temperature (e.g., is temperature dependent, temperature-sensitive). Since the CTAT circuit displays a negative temperature coefficient, the pulse width of $PWM_{CTAT}$ decreases as temperature increases. In some examples, the temperature sensor may be designed such that the $PWM_{CTAT}$ pulse width is always less than the $PWM_{REF}$ pulse width, so that a simple comparison of the two pulse-widths provides the temperature measurement. This is accomplished by providing that $V_{CTAT} < V_{REF}$ across all design corners. In some examples, the pulse-width corresponding to either $V_{REF}$ or $V_{CTAT}$ can be frequency modulated to distinguish the two-pulses, but this may be at the cost of additional circuit complexity. However, in some applications, using frequency modulation may improve the resolution and reduced error of the temperature sensor by ~2× factor.

Figure 9A:
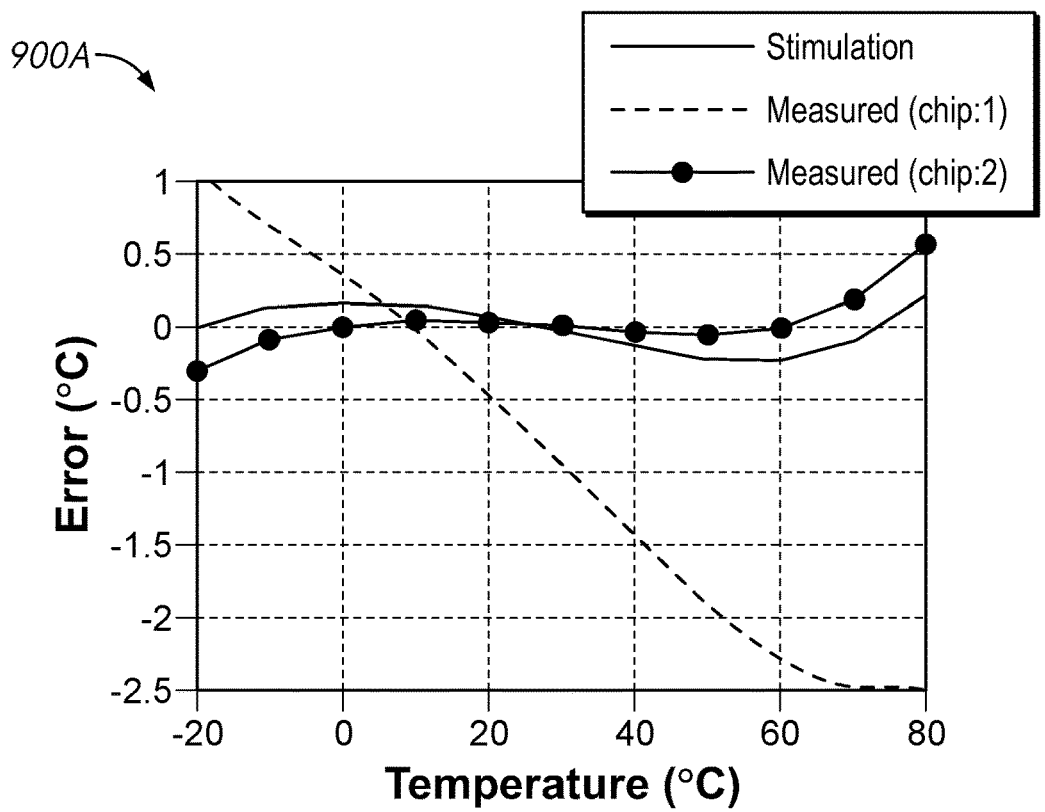
FIGS. 9A and 9B are error plots for an example implementation in accordance with examples disclosed herein.
Figure 9B:
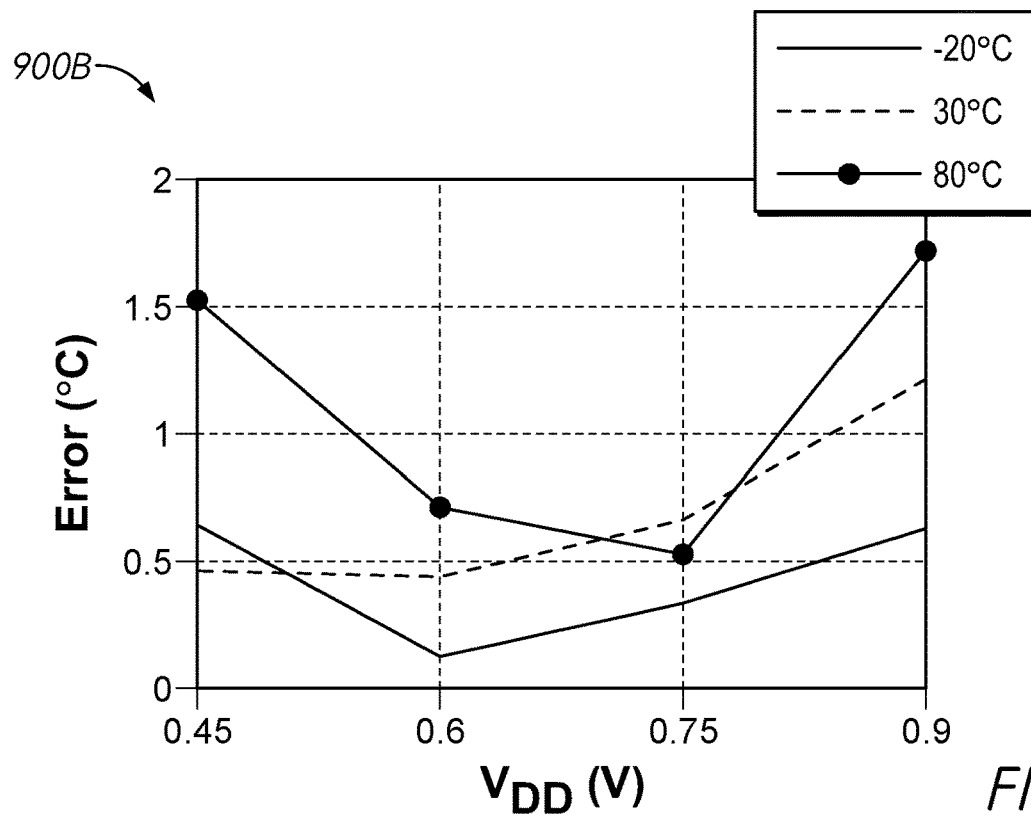

FIGS. 9A and 9B are error plots for an example implementation in accordance with examples disclosed herein. Two sample temperature sensor circuits according to the present disclosure (chip 1 and chip 2) were fabricated using a 65 nm CMOS process using devices having the values provided herein as the example implementation. The accuracy of the two sample temperature sensor circuits were measured across a range of temperatures from −20-80° C. The error is plotted versus temperature in plot 900A of FIG. 9A. The measured temperature inaccuracy ranges between −2.5/+1° C. for chip 1 and −0.45/+0.5° C. for chip 2. The example implementation of the temperature sensor circuit was also simulated in software and the error of the simulated temperature sensor circuit is also plotted in plot 900A. The relative inaccuracy of chip 1, compared to chip 2 may be attributed to the reduced sensitivity of the CTAT circuit on chip 1 due to manufacturing variations. Plot 900B in FIG. 9B shows the average error for the two sample temperature sensor circuits for minimum, nominal and maximum temperature of −20, 30 and 80° C. across a supply voltage $V_{DD}$ range of 0.45V-0.9V. The error is minimal at mid-voltage range of 0.6-0.75V and increases at both low and high temperature, which may be due to the degradation of the reference voltage generator circuit at low temperature and the increased operating frequency at high temperature.

The temperature sensor circuits disclosed herein may provide temperature sensors with reduced output power consumption and may allow operation with ultra-low supply voltages. The temperature sensors disclosed herein may not require a reference current generator, an OTA, or a precision ADC. In some example implementations, the power consumption may be as low as 17.6 nW and may operate at supply voltages as low as 450 mV. The temperature sensor circuits disclosed herein may not need on-line calibration. That is, they may only need calibration after fabrication at the validation stage.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present apparatuses, systems, and methods and should not be construed as limiting the appended claims to any particular embodiment or group of embodiments. Thus, while the present apparatuses, systems, and methods have been described in particular detail with reference to exemplary embodiments, it should also be appreciated that numerous modifications and alternative embodiments may be devised by those having ordinary skill in the art without departing from the broader and intended spirit and scope of the present apparatuses, systems, and methods as set forth in the claims that follow. Accordingly, the specification and drawings are to be regarded in an illustrative manner and are not intended to limit the scope of the appended claims.

What is claimed is:

1. A temperature sensor, comprising:
   a complementary-to-absolute-temperature (CTAT) circuit configured to provide a CTAT voltage;
   a voltage reference circuit, wherein the voltage reference circuit comprises a main stage and a bulk feedback network, wherein the voltage reference circuit is configured to provide a reference voltage;
   a waveform generator circuit configured to output a waveform;
   a first comparator circuit configured to compare the waveform to the CTAT voltage and output a first pulse-width-modulated (PWM) signal;
   a second comparator circuit configured to compare the waveform to the reference voltage and output a second PWM signal; and
   an output stage circuit configured to combine the first PWM signal into a first pulse of an output signal and encode the second PWM signal into a second pulse of the output signal, wherein a ratio of the first pulse and the second pulse is indicative of a temperature.

2. The temperature sensor of claim 1, wherein the waveform generator circuit comprises:
   an oscillator circuit configured to output a periodic signal;
   a frequency divider circuit configured to divide a frequency of the periodic signal;
   a sawtooth generator circuit configured to generate the waveform based, at least in part, on the periodic signal divided by the frequency divider.

3. The temperature sensor of claim 2, wherein the sawtooth generator circuit includes a second CTAT circuit that replicates the CTAT circuit.

4. The temperature sensor of claim 2, wherein the sawtooth generator circuit includes a capacitively loaded current-starved inverter.

5. The temperature sensor of claim 2, wherein the oscillator circuit includes an inverter-based ring oscillator.

6. The temperature sensor of claim 2, wherein the frequency divider circuit comprises a plurality of cascaded true-single-phase flip-flops.

7. The temperature sensor of claim 1, wherein the output stage comprises:
- a multiplexer configured to receive the first PWM signal and the second PWM signal and output either the first PWM signal or the second PWM signal based on a state of a first timing signal; and
- a NAND logic circuit configured to receive either the first PWM signal or the second PWM from the multiplexer as a first input and a second timing signal as a second input, wherein the NAND logic circuit is configured to provide the output signal based, at least in part, on the first input and the second input.

8. The temperature sensor of claim 7, wherein at least one of the first timing signal or the second timing signal is provided by the waveform generator circuit.

9. A method comprising:
- comparing a temperature-sensitive voltage signal to a waveform and providing a first pulse-width modulated (PWM) signal based on the comparing;
- comparing a reference voltage signal to the waveform and providing a second PWM signal based on the comparing;
- combining the first PWM signal and the second PWM signal into an output signal, wherein a first pulse of the output signal corresponds to the first PWM signal and a second pulse of the output signal corresponds to the second PWM signal; and
- taking a ratio of a width of the first pulse and a width of the second pulse to determine a temperature.

10. The method of claim 9, wherein combining the first PWM signal and the second PWM signal comprises:
- providing the first PWM signal to a first input of a logic circuit when a first timing signal is in a first state;
- providing the second PWM signal to the first input of the logic circuit when the first timing signal is in a second state;
- providing a second timing signal to a second input of the logic circuit; and
- providing the output signal from an output of the logic circuit.

11. The method of claim 9, further comprising performing a calibration, wherein the calibration comprises measuring the temperature-sensitive voltage at a first temperature and a second temperature.

12. The method of claim 9, further comprising:
- receiving the output signal at a counter;
- generating a count based, at least in part, on a clock signal; and
- providing the count to a first memory when a switch is in a first state;
- providing the count to a second memory when the switch is in a second state; and
- providing the temperature from the first memory or the second memory.

13. The method of claim 9, wherein the output signal further comprises a plurality of first pulses corresponding to the first PWM signal and a plurality of second pulses corresponding to the second PWM signal, the method further comprising:
- taking ratios of individuals ones of the plurality of first pulses and corresponding ones of the plurality of second pulses; and
- averaging the ratios to determine the temperature.

14. A temperature sensor, comprising:
- a first circuit configured to provide a temperature-sensitive voltage;
- a voltage reference circuit, wherein the voltage reference circuit comprises a main stage and a bulk feedback network, wherein the voltage reference circuit is configured to provide a reference voltage;
- a first comparator circuit configured to compare the temperature-sensitive voltage to a waveform and output a first signal;
- a second comparator circuit configured to compare the reference voltage and the waveform and output a second signal; and
- an output stage circuit configured to combine the first signal and the second signal into an output signal including a first pulse and a second pulse, wherein a ratio of the first pulse and the second pulse is indicative of a temperature.

15. The temperature sensor of claim 14, wherein the first circuit is configured to exhibit a negative temperature coefficient.

16. The temperature sensor of claim 14, wherein the first circuit includes a first transistor coupled in series with a second transistor, wherein a threshold voltage of the first transistor is less than a threshold voltage of the second transistor.

17. The temperature sensor of claim 16, wherein the first transistor and the second transistor are N-channel transistors.

18. The temperature sensor of claim 14, wherein the bulk feedback network of the voltage reference circuit includes a first auxiliary stage and a second auxiliary stage coupled to the first auxiliary stage.

19. The temperature sensor of claim 14, wherein at least one of the first comparator or the second comparator include a PMOS input and a cross-coupled NMOS active load.

20. The temperature sensor of claim 19, wherein the PMOS input comprises low threshold voltage devices and the cross-coupled NMOS active load comprises high threshold voltage devices.

* * * * *